United States Patent [19]

Bedard

[11] Patent Number: 5,894,248

[45] Date of Patent: Apr. 13, 1999

[54] CONTROLLED LOOP GAIN YIG TUNED OSCILLATOR CIRCUIT

[75] Inventor: Alden Bedard, Morgan Hill, Calif.

[73] Assignee: Wiltron Company, Morgan Hill, Calif.

[21] Appl. No.: 08/872,743

[22] Filed: Jun. 11, 1997

[51] Int. Cl.$^6$ .................................................. H03B 1/00
[52] U.S. Cl. ...................... 331/177 R; 331/117 D; 331/96; 331/74; 331/107 DP; 333/219.2
[58] Field of Search ................... 331/109, 96, 177 V, 331/107 DP, 74, 117 D, 66, 177 R, 183; 333/219.2, 202, 235; 455/264, 257

[56] References Cited

U.S. PATENT DOCUMENTS

| 5,115,209 | 5/1992 | Grace et al. | 331/49 |
| 5,606,294 | 2/1997 | Richards | 331/109 |
| 5,654,678 | 8/1997 | Miyazaki | 331/176 |

FOREIGN PATENT DOCUMENTS 0048801  3/1987  Japan .................... 331/107 DP

OTHER PUBLICATIONS

J. Helszajn, *Yig Resonators and Filters*, 1985, pp. 1–16, 159–170 and 191–201, published by John Wiley & Sons.

Primary Examiner—Robert Pascal
Assistant Examiner—Arnold Kinkead

Attorney, Agent, or Firm—Fliesler, Dubb, Meyer & Lovejoy

[57] ABSTRACT

A YIG oscillator circuit including a closed loop control system which maximizes loop gain during start-up and minimizes loop gain after start-up to minimize gain compression. In one embodiment the closed loop control circuit includes a PIN diode coupled between the collector and base of a BJT, and comparison circuitry for comparing the YIG oscillator output voltage level with a reference voltage and providing a resulting feedback current to the PIN diode at the collector of the BJT. In operation, during start-up when the output voltage of the YIG oscillator is less than the reference voltage, the feedback current will be minimal and the PIN diode will reverse bias to maximize loop gain. When the output voltage approaches the reference voltage level, the feedback current will increase to forward bias the PIN diode to reduce loop gain and minimize gain compression. In a second embodiment, the PIN diode is not included, and the closed loop control circuit output signal is coupled to the emitter of the BJT. In operation with the second embodiment, during start-up current provided to the emitter of the BJT will be at a maximum and the BJT reflection coefficient will be unaffected to maximize loop gain. When operation approaches steady-state, feedback current will decrease current to the emitter of the BJT to reduce the reflection coefficient of the BJT and thus reduce overall loop gain.

5 Claims, 4 Drawing Sheets

CONTROLLED LOOP GAIN YIG TUNED OSCILLATOR CIRCUIT

BACKGROUND OF THE INVENTION

1. Field of the Invention

The present invention relates to a yttrium iron garnet (YIG) crystal oscillator circuit. More particularly, the present invention relates to control of loop gain in the YIG oscillator circuit to minimize FM noise and harmonics.

2. Description of the Related Art

A YIG crystal resonates at a microwave frequency when placed in a magnetic field. To create a tunable YIG oscillator circuit, a reactive component or YIG resonator is first formed by placing a YIG sphere in the air gap of an electromagnet. Current is then applied to the windings of the electromagnet using an active device such as a field effect transistor (FET) or bipolar junction transistor (BJT) to change the magnetic field as desired in order to obtain a desired frequency of oscillation. The frequency of oscillation of the YIG crystal is related only to the strength of the magnetic field applied and not to the dimensions of the sphere. General background on YIG crystals and circuits using YIG crystals can be found in J. Helszajn, "YIG Resonators and Filters," John Wiley & Sons (New York: 1985), incorporated herein by reference.

The YIG oscillator typically operates at a steady-state power level which is arrived at when the "loop gain" for the YIG oscillator is reduced to unity through gain compression. Loop gain is determined by the reflection coefficient of the YIG resonator multiplied by the reflection coefficient of the active component. Gain compression occurs when an increase in the RF input power versus RF output power of the active component deviates from linearity. As shown in FIG. 1, when gain compression occurs, the reflection coefficient of the active component reduces as the RF input power level increases.

To achieve start-up, loop gain must be greater than one. If the initial loop gain is large compared to one, the amount of gain compression required for the oscillator to reach steady-state oscillation will be large. Significant compression causes the oscillator to operate in a very non-linear manner, causing high FM noise levels, and high harmonic distortion, the former due to up-conversion of base-band active component noise.

To minimize compression, and thus reduce noise, initial loop gain is typically minimized, yet the initial loop gain must remain greater than one to ensure start-up. With an oscillator operating over a broad bandwidth, keeping the initial loop gain very close to one over the entire frequency band is difficult. Changes in ambient temperature and component drift over time further affect control of the loop gain making a broadband design even more difficult.

SUMMARY OF THE INVENTION

The present invention is a closed loop control system for use with a YIG oscillator circuit which maximizes loop gain during start-up and minimizes loop gain after start-up when operation approaches steady state to minimize gain compression.

In a first embodiment the closed loop control circuit includes a PIN diode coupled between the collector and base of a BJT which serves as the active component of the YIG oscillator circuit, and comparison circuitry for comparing the YIG oscillator circuit output voltage level with a reference voltage set to a desired output voltage level and providing the comparison result as a feedback current to the PIN diode at the collector of the BJT.

In operation with the first embodiment, during start-up when the output voltage of the YIG oscillator circuit is substantially less than the reference voltage, the feedback current from the comparison circuit will be minimal causing the PIN diode to reverse bias to provide a high resistance. The high resistance of the PIN diode prevents the PIN diode from affecting the reflection coefficient of the BJT so that loop gain is maximized. When the output voltage of the YIG oscillator circuit approaches the reference voltage level, the feedback current from the comparison circuit will increase causing the PIN diode to forward bias and provide a decreased resistance. The decreased resistance of the PIN diode reduces the reflection coefficient of the BJT to reduce loop gain and, thus, minimize gain compression.

In a second embodiment of the present invention, the closed loop control circuit includes a comparison circuit for comparing the YIG oscillator circuit output voltage with a reference voltage and providing the result as a feedback current to a terminal of the YIG resonator connected opposite the BJT. The second embodiment does not further include a PIN diode as did the first embodiment.

In operation with the second embodiment, during start-up when the output voltage of the YIG oscillator circuit is substantially less than the reference voltage, the current provided to the emitter of the BJT will be at a maximum. Thus, loop gain will be maximized to assure start-up occurs properly. When the output voltage of the YIG oscillator circuit approaches the reference voltage level, the feedback current from the comparison circuit will decrease the total current provided at the emitter of the BJT. Gain and reflection coefficient of the BJT is thus reduced to minimize loop gain and prevent the BJT from going into compression.

BRIEF DESCRIPTION OF THE DRAWINGS

Further details of the present invention are explained with the help of the attached drawings in which.

DETAILED DESCRIPTION

Figure 1:
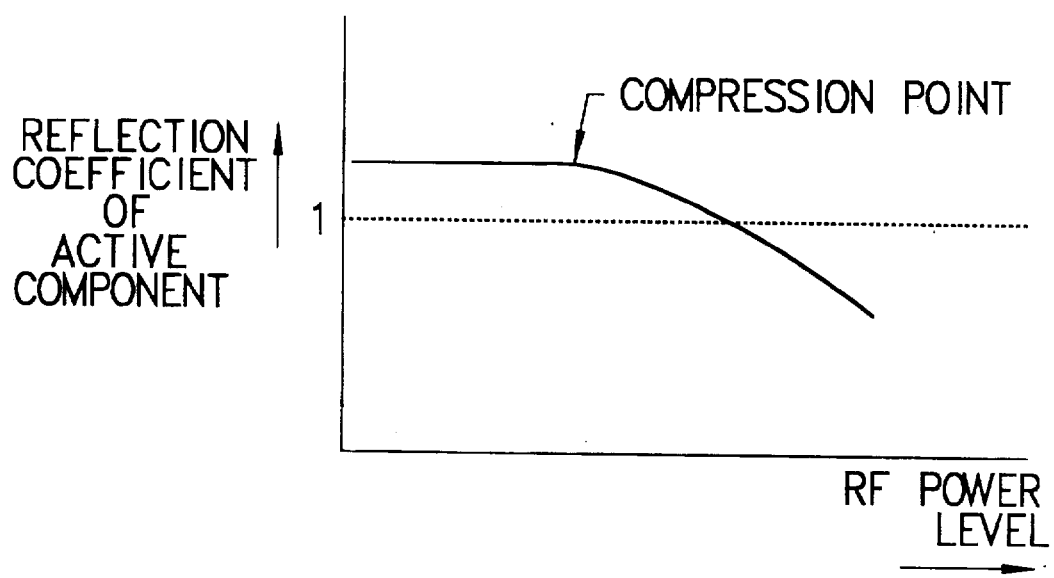
FIG. 1 shows the reflection coefficient of an active component such as a transistor vs. RF power level before and after gain compression.
Figure 2:
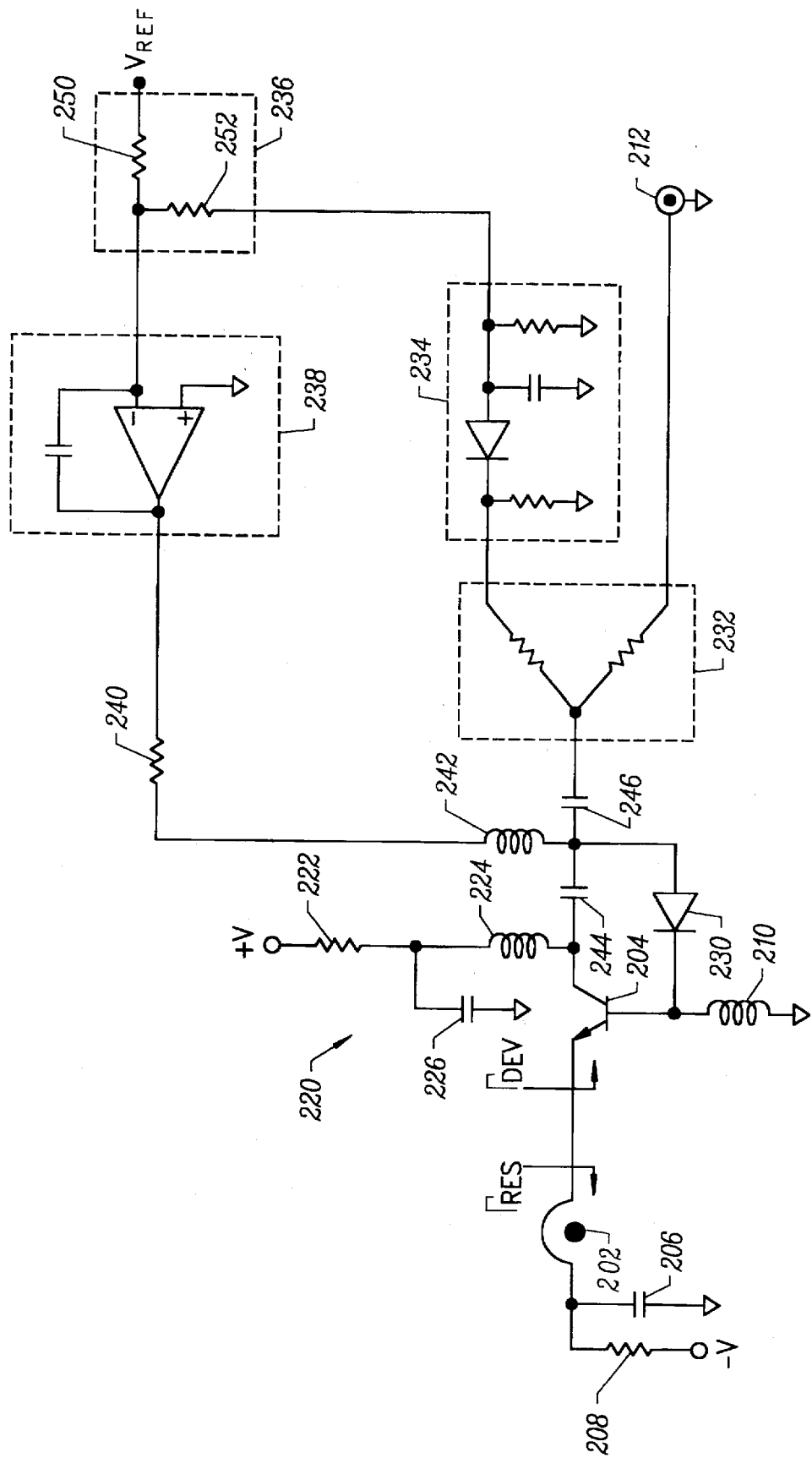
FIG. 2 shows a YIG oscillator circuit with a closed loop control system of the present invention.

FIG. 2 shows a YIG oscillator circuit with a closed loop control system of the present invention. The YIG oscillator circuit shown includes a YIG resonator 202 connected between the emitter of a bipolar junction transistor (BJT) 204 and a node which is connected through a capacitor 206 to ground, and through a resistor 208 to a negative power supply terminal (−V). The base of transistor 204 is connected through a feedback network to ground, the feedback network including inductor 210. The collector of transistor 204 is coupled to an RF power output 212, and to a biasing network 220. The biasing network 220 includes a series resistor 222 and inductor 224 connecting a positive power supply (+V) to the collector of transistor 214. A capacitor 226 which is further included in the biasing network connects the junction of resistor 222 and inductor 224 to ground.

Operation of the YIG oscillator circuit described to this point is standard and will not be described in detail. In general, the biasing network 220 introduces an appropriate positive DC voltage to ensure that the BJT 204 is oscillating, and that the oscillations generated will reach the RF power output 212.

As indicated previously, it is desirable to control loop gain to minimize FM noise and harmonics. For the circuitry described to this point, loop gain is the reflection coefficient $\Gamma_{RES}$ looking into the YIG resonator 202 multiplied by the reflection coefficient $\Gamma_{DEV}$ looking into transistor 204. The remaining components of FIG. 2 described below provide the closed loop control circuit which controls the reflection coefficient $\Gamma_{DEV}$ of the transistor 204, and likewise loop gain, to reduce compression in the YIG oscillator after start-up and thus minimize FM noise and harmonics.

In FIG. 2, the closed loop control circuit includes a PIN diode 230 coupling the collector of transistor 204 to its base. Additionally the closed loop control circuit includes circuitry for comparing the output voltage at the RF power output 212 to a reference voltage ($V_{REF}$). The voltage $V_{REF}$ has a value set to a desired steady state voltage level for the RF power output 212. The closed loop control circuit applies a current corresponding to the difference between $V_{REF}$ and the output voltage to the PIN diode 210 at the collector of transistor 204 to control the reflection coefficient $\Gamma_{DEV}$ and, thus, to control loop gain.

The comparison circuit includes a power splitter 232 to couple power to the RF power output 212 and to the closed loop control circuit. The power splitter has a first end coupled to the collector of transistor 204, a second end coupled to the RF power output terminal 212 and a third end connected to a first terminal of an envelope detector 234. A signal indicating the voltage level of the RF output 212 is, thus, provided to a second terminal of the envelope detector 234 and is compared with the voltage reference $V_{REF}$ in a comparison circuit 236. The comparison circuit 236 includes a simple resistor divider with a first resistor 250 connecting $V_{REF}$ to the input of integrator 238 and a second resistor 252 connecting the second terminal of the envelope detector 234 to the input of integrator 238. The comparison circuit 236, thus, provides a difference between $V_{REF}$ and the RF output voltage level at its output. The output of the comparison circuit 236 is connected to an integrator 238 which integrates the difference between $V_{REF}$ and the output voltage over time. The integrator 238 output is coupled through a series resistor 240 and inductor 242 to the PIN diode 230.

DC voltage blocking is provided by capacitors 244 and 246. Capacitor 244 is connected from the junction of the collector of transistor 204 and inductor 224 to the junction of PIN diode 210 and inductor 242. Capacitor 246 is connected from the junction of PIN diode 230 and inductor 246 to the first terminal of power splitter 232.

In operation without the closed loop control circuit, a reflection coefficient $\Gamma_{DEV}$ provided by transistor 204 will remain at an initial value. With the closed loop control circuit added, when the PIN diode 230 is reverse biased and provides a high resistance, the reflection coefficient $\Gamma_{DEV}$ maintains the initial value. However, when the PIN diode 230 is forward biased, the reflection coefficient $\Gamma_{DEV}$ will change from the initial value dependent on the resistance of the PIN diode. The resistance of the PIN diode 230 will be dependent upon the current provided from inductor 242, resistance of the PIN diode 230 decreasing as current from the inductor 242 increases.

Thus, with the closed loop control circuit, during start-up when $V_{REF}$ is substantially greater than the RF output voltage, the voltage at the input to the integrator 238 will be significantly below $V_{REF}$ and no significant current will be provided from inductor 242. With no current provided from inductor 242, the PIN diode 230 will be reverse biased and provide a high resistance so the reflection coefficient $\Gamma_{DEV}$ of transistor 204 will maintain its initial value. Thus, the closed loop control circuit enables high gain to assure start-up occurs properly.

As operation conditions approach steady-state, the difference between the RF output voltage and $V_{REF}$ will decrease, increasing the voltage at the input of integrator 238, resulting in increased current from inductor 242. With increased current from inductor 242, the PIN diode 230 will forward bias and provide a decreased resistance resulting in a lower reflection coefficient $\Gamma_{DEV}$ for transistor 204. With the reflection coefficient $\Gamma_{DEV}$ decreasing, loop gain will decrease to minimize gain compression in the transistor 204.

With the embodiment of present invention shown in FIG. 2, the YIG oscillator circuit can operate at a fairly low output power level, so the BJT 204 will be operating in a very linear region across the entire operating bandwidth during steady-state conditions. With the YIG resonator 202 operating in a linear range the harmonic content in the RF output spectrum will be low and little up-conversion of base-band device noise to the microwave output frequency will occur, resulting in a reduction in overall FM noise levels.

Figure 3:
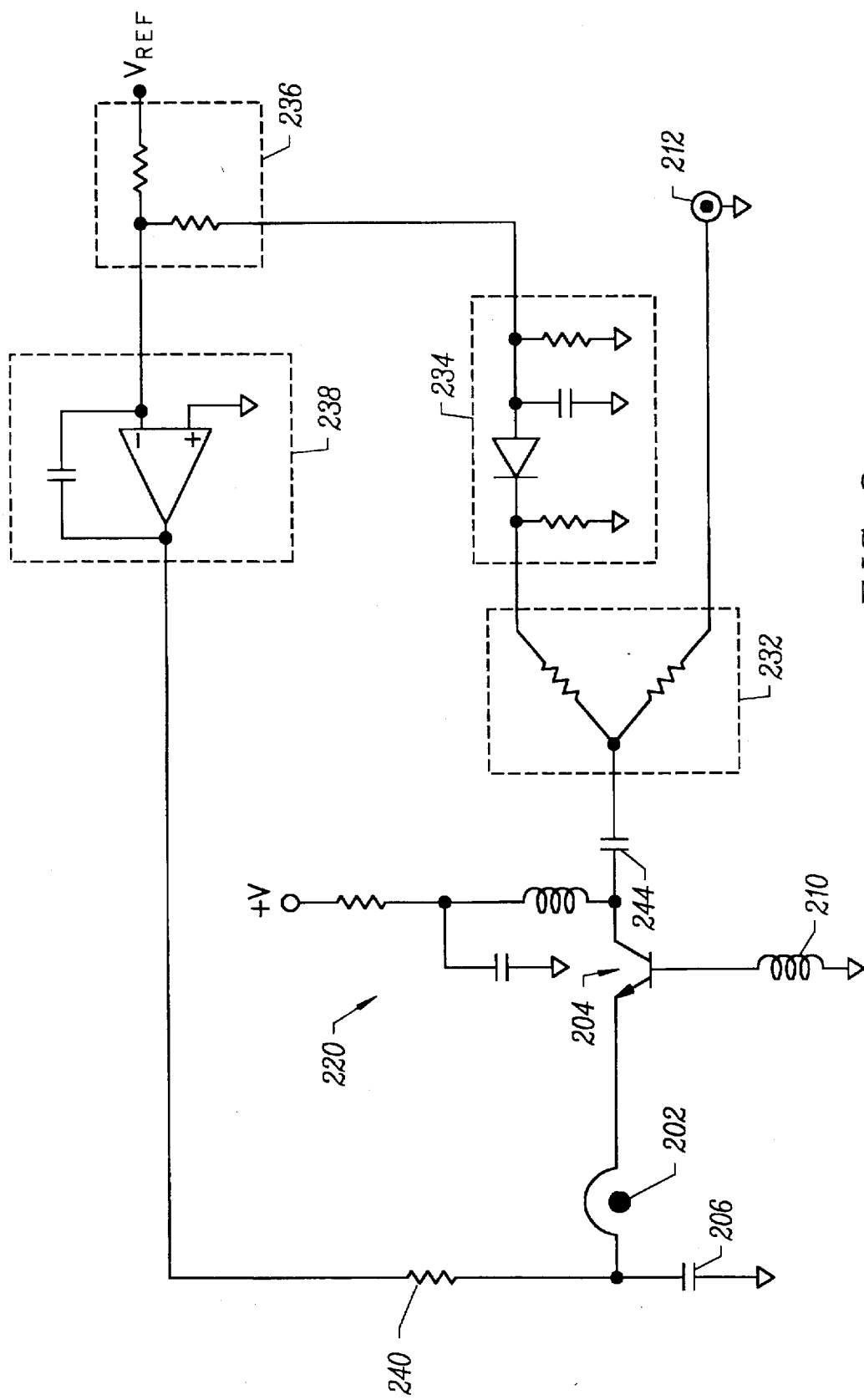
FIG. 3 shows an alternative embodiment of a closed loop control system of the present invention.
Figure 4:
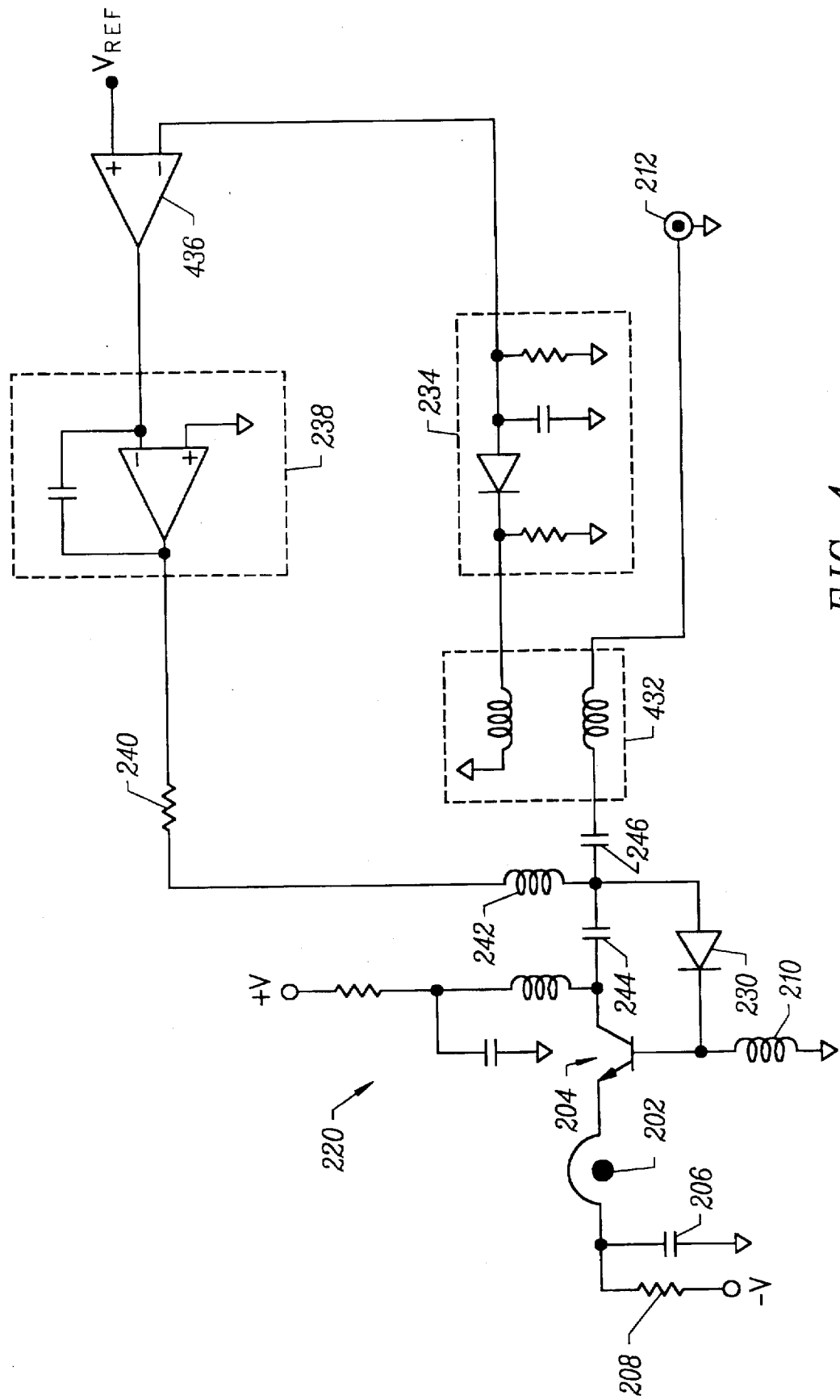
FIG. 4 shows an alternative circuitry for use in a closed loop control system of the present invention.

FIG. 3 shows an alternative embodiment of a closed loop control system of the present invention. The YIG oscillator circuit of FIG. 3 is modified from FIG. 2 to remove the PIN diode 230, inductor 242 and resistor 208 and to connect the output of resistor 240 from integrator 238 to the terminal of the YIG oscillator connected to capacitor 206. Note that components which are carried over from FIG. 3 to FIG. 4 are similarly labeled, as will be components carried over from FIG. 2 in subsequent drawings.

In operation, the circuit of FIG. 3 controls the reflection coefficient $\Gamma_{DEV}$ of transistor 204 by controlling the emitter current, Ie, of the transistor 204. During start-up when $V_{REF}$ is substantially greater than the RF output voltage, maximum current will be provided to the emitter of BJT 204. The reflection coefficient $\Gamma_{DEV}$ of the BJT 204 will, thus, maintain its initial value and loop gain will be maximized to assure start-up occurs properly.

As operation conditions approach steady-state, the difference between the RF output voltage and $V_{REF}$ will decrease, and the feedback current from the resistor 240 will cause a decrease in current to the emitter of BJT 204. With less emitter current, the reflection coefficient $\Gamma_{DEV}$ will be reduced, allowing steady state oscillation with minimal compression and subsequent distortion.

Thus, as with the circuit of FIG. 2, with the embodiment of present invention shown in FIG. 3, the YIG oscillator circuit can operate in a very linear region across the entire operating bandwidth, both during start-up and during steady-state conditions. With the YIG oscillator operating in a linear range overall noise levels are reduced.

FIG. 4 shows alternative circuitry for use in a closed loop control system of the present invention. First in FIG. 4, the power splitter 232 is replaced by a coupler 432. The through-arm of the coupler 432 couples the collector of transistor 204 to the output terminal 212, while the coupling-arm connects to the first terminal of the envelope detector 234. Because the power level of the coupling-arm is reduced with respect to the through arm, unlike with a power splitter, $V_{REF}$ should be proportionately reduced to obtain the same performance.

Further in FIG. 4, the comparison circuit 236 is replaced with a comparator 436. Comparator 436 has an inverting input terminal connected to the second terminal of the envelope detector, and a non-inverting terminal connected to $V_{REF}$. As with the comparison circuit 236, the comparator 436 will provide a voltage signal dependent on the difference between $V_{REF}$ and the RF output voltage from the second terminal of the envelope detector 234. The output of the comparator 436 is connected to the input of integrator 238.

Although the invention has been described above with particularity, this was merely to teach one of ordinary skill in the art how to make and use the invention. Many modifications will fall within the scope of the invention, as that scope is defined by the claims which follow. For instance, the integrator 238 might be replaced by a direct connection. Additionally, although FIG. 4 shows changes to the circuit of FIG. 2, similar changes can be made to the circuit of FIG. 3. Further, although FIGS. 2 and 3 show use of a YIG tuned oscillator circuit using BJTs in the common base configuration, the closed loop control circuit of the present invention could be applied to other BJT circuits, or to a YIG oscillator circuit using FETs.

What is claimed is:

1. A YIG oscillator circuit comprising:

a YIG resonator;

a transistor having an emitter coupled to the YIG resonator and a collector coupled to an RF output terminal;

a PIN diode having a first terminal coupled to the collector of the transistor and a second terminal coupled to a base of the transistor; and comparing means for comparing an output voltage at the RF output terminal with a reference voltage and providing a feedback current indicating a difference between the output voltage and the reference voltage to the first terminal of the PIN diode.

2. The YIG oscillator circuit of claim 1 wherein the comparing means comprises:

a power splitter having a first terminal coupled to a collector of the transistor, a second terminal coupled to the RF output terminal, and a third terminal;

an envelope detector having a first terminal coupled to the third terminal of the power splitter, and a second terminal;

an integrator having an inverting terminal coupled by a first resistor to the reference voltage and by a second resistor to the second terminal of the envelope detector, and an output; and an inductor coupling the output of the integrator to the first terminal of the PIN diode.

3. A YIG oscillator circuit comprising:

a YIG resonator;

a transistor having an emitter coupled to a first terminal of the YIG resonator and a collector coupled to an RF output terminal; and a closed loop control means coupled to the RF output terminal and connected to a second terminal of the YIG resonator, the closed loop control means comparing an output voltage level at the RF output terminal with a reference voltage, and feeding back current to the second terminal of the YIG resonator indicating a difference between the output voltage and the reference voltage to reduce loop gain after start-up of the YIG oscillator.

4. A YIG oscillator circuit comprising:

a YIG resonator;

a transistor having an emitter coupled to the YIG resonator, a base, and a collector;

a PIN diode having a first terminal coupled to the collector of the transistor and a second terminal coupled to the base of the transistor;

a power splitter having a first terminal coupled to the collector of the transistor, a second terminal coupled to an RF output terminal, and a third terminal;

an envelope detector having a first terminal connected to the third terminal of the power splitter, and a second terminal;

an integrator having an inverting input connected to a voltage reference by a first resistor and to the second terminal of the envelope detector by a second resistor, and an output; and an inductor coupling the output of the integrator to the first terminal of the PIN diode.

5. A YIG oscillator circuit comprising:

a YIG resonator having a first terminal and a second terminal;

a transistor having an emitter coupled to the first terminal of the YIG resonator, a base, and a collector;

a power splitter having a first terminal coupled to the collector of the transistor, a second terminal coupled to an RF output terminal, and a third terminal;

an envelope detector having a first terminal connected to the third terminal of the power splitter, and a second terminal; and an integrator having an inverting input connected to a voltage reference by a first resistor and to the second terminal of the envelope detector by a second resistor, and an output; and a resistor coupling the output of the integrator to the second terminal of the YIG resonator.

* * * * *